United States Patent [19]
Woody

[11] Patent Number: 5,457,378
[45] Date of Patent: Oct. 10, 1995

[54] ELECTROMAGNETICALLY SHIELDED INDUCTIVE CHARGING APPARATUS

[75] Inventor: George R. Woody, Redondo Beach, Calif.

[73] Assignee: Hughes Aircraft Company, Los Angeles, Calif.

[21] Appl. No.: 237,564

[22] Filed: Apr. 29, 1994

[51] Int. Cl.$^6$ ........................................ H02L 7/00
[52] U.S. Cl. ................................. 320/21; 320/2
[58] Field of Search ........................................ 320/2, 21

[56] References Cited

U.S. PATENT DOCUMENTS

| | | | |
|---|---|---|---|
| 3,938,018 | 2/1976 | Dahl | 320/2 |
| 4,347,472 | 8/1982 | Lemelson | 320/2 |
| 4,436,970 | 3/1984 | Swisher | 200/61.56 |
| 4,496,896 | 1/1985 | Melocik et al. | 320/2 |
| 4,800,328 | 1/1989 | Bolger et al. | 320/2 |
| 4,843,852 | 7/1989 | Foshee et al. | 70/367 |
| 5,070,293 | 12/1991 | Ishii et al. | 320/2 |
| 5,157,319 | 10/1992 | Klontz et al. | 320/2 |
| 5,180,050 | 1/1993 | Rada et al. | 200/329 |
| 5,264,776 | 11/1993 | Hulsey | 320/2 |

*Primary Examiner*—Kristine L. Peckman
*Attorney, Agent, or Firm*—Leonard A. Alkov; W. K. Denson-Low

[57] ABSTRACT

An electromagnetically shielded inductive charging apparatus for use in charging a battery of an electric vehicle, for example. The inductive charging apparatus comprises an inductive charging coupler and a charge port disposed in the electric vehicle and coupled to the battery of the electric vehicle. The charging coupler comprises a center magnetic core, and a primary winding disposed around the center magnetic core. A charger cable is coupled between the primary winding and an external power source for coupling energy to the charging coupler. A plastic coupler housing is provided that has two mating coupler halves that are configured to provide a handle, and the mating coupler halves enclose the primary winding and the center magnetic core, and secures the charger cable in the handle. A plurality of metallized ribs are disposed in the handle that engage outer shielding braid of the charger cable. A conductive plastic strip is disposed along an exterior portion of the coupler between the handle and the primary winding. The charge port has an opening into which the inductive charging coupler is inserted. A plurality of metallized electromagnetic interference (EMI) fingers protrude into the opening and that press against the conductive plastic strip when the coupler is inserted into the charge port. The engagement of the conductive plastic strip and the EMI fingers provides for complete EMI shielding of the charging apparatus.

4 Claims, 1 Drawing Sheet

ELECTROMAGNETICALLY SHIELDED INDUCTIVE CHARGING APPARATUS

BACKGROUND

The present invention relates to inductive chargers, and more particularly, to inductive charging apparatus employing a conductive plastic EMI ground for vehicle applications, and the like.

The assignee of the present invention designs, develops and manufactures inductive charging systems for use in charging electric batteries of electric vehicles, and the like. Earlier inductive couplers developed by the assignee of the present invention did not have grounding capability to provide for shielding. The earlier-developed couplers were made of pure plastic and as such had no provisions for EMI shielding. FCC and customer EMI requirements therefore could not be met.

Therefore, it is an objective of the present invention to provide for inductive charging apparatus employing a conductive plastic EMI ground for vehicle applications, and the like.

SUMMARY OF THE INVENTION

In order to meet the above and other objectives, the present invention is an electromagnetically shielded inductive charging apparatus for use in charging a battery of an electric vehicle. The inductive charging apparatus comprises an inductive charging coupler and a charge port disposed in the electric vehicle and coupled to the battery of the electric vehicle. The charging coupler comprises a center magnetic core, and a primary winding disposed around the center magnetic core. A charger cable is coupled between the primary winding and an external power source for coupling energy to the charging coupler. A plastic coupler housing is provided that has two mating coupler halves that are configured to provide a handle, and the mating coupler halves enclose the primary winding and the center magnetic core, and secures the charger cable in the handle. A plurality of metallized ribs are disposed in the handle that engage outer shielding braid of the charger cable. A conductive plastic strip is disposed along an exterior portion of the coupler between the handle and the primary winding.

The charge port has an opening into which the inductive charging coupler is inserted. A plurality of metallized electromagnetic interference (EMI) fingers protrude into the opening and that engage the conductive plastic strip when the coupler is inserted into the charge port. The engagement of the conductive plastic strip and the EMI fingers provides for complete EMI shielding of the charging apparatus.

The inductive charging apparatus provides a medium wherein electric power is transferred to the vehicle battery, for example, by means of inductive coupling. The conductive plastic strip on the outside of the coupler provides a 360 degree ground connection to the mating charge port for the purpose of providing electromagnetic interference (EMI) shielding.

The present coupler is designed to give a user a sense of safety when the coupler is used to transfer electric power to charge batteries of an electric vehicle. The coupler is made of plastic with no exposed metal contacts such as are conventionally used to transfer power with conventional connectors. The coupler, although made plastic, provides a noninductive solid ground connection without the appearance of exposed metal.

The present coupler may be used in inductive chargers for electric vehicles. The present coupler has been designed for use with a 6.6 kw charger, a 1.5 kw charger, and a 25 to 50 kw charger manufactured by the assignee of the present invention. In addition the coupler may be used with chargers that provide very high power up to 200 kw.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
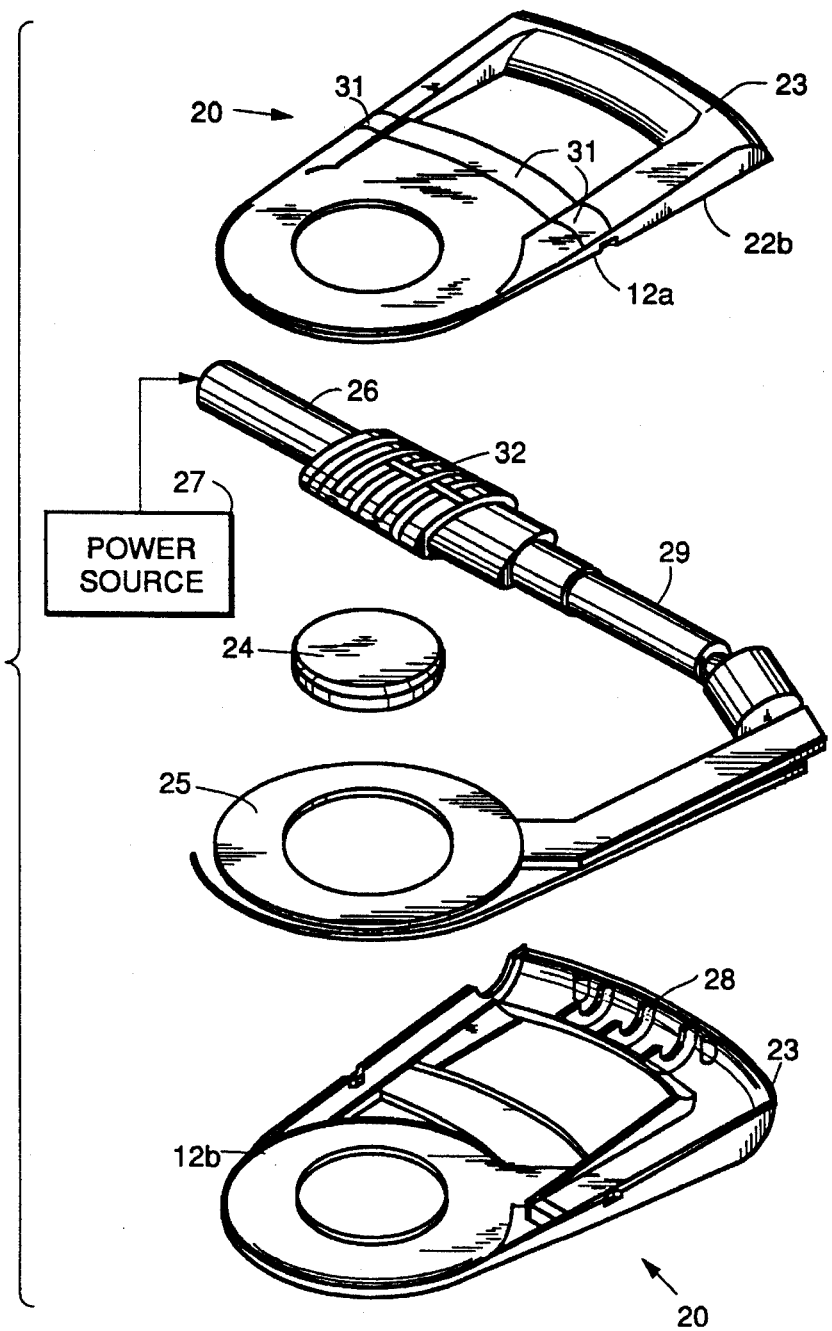
FIG. 1 illustrates an exploded perspective view of an inductive charging coupler in accordance with the principles of the present invention.
Figure 2:
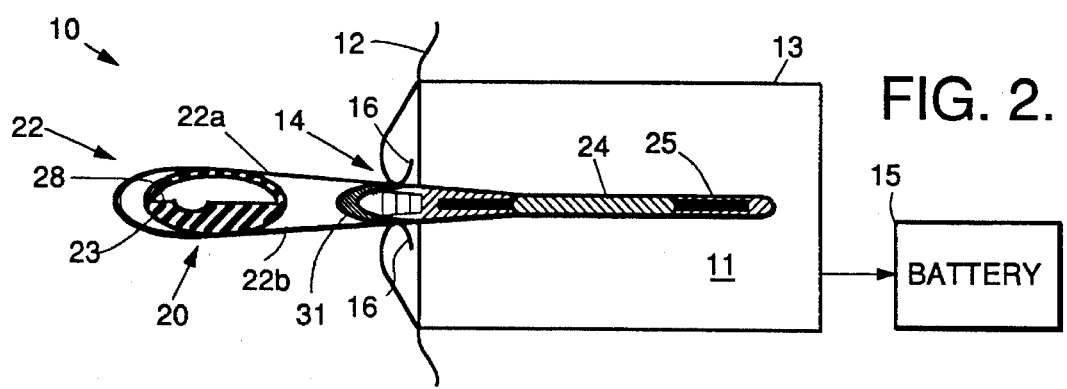
FIG. 2 is a cross sectional view of inductive charging apparatus that comprises the inductive charging coupler of FIG. 1 inserted into a charging port.

Referring to the drawing figures, FIG. 1 illustrates an exploded perspective view of an inductive charging coupler 20 in accordance with the principles of the present invention, while FIG. 2 is a cross sectional view of inductive charging apparatus 10 that comprises the inductive charging coupler 20 of FIG. 1 inserted into a charge port 11 in an electric vehicle 12, for example.

The charge port 11 includes a housing 13 having an opening 14 into which the inductive charging coupler 20 is inserted. The charge port 11 is coupled to a battery 15 of the electric vehicle 12 in which it is housed. The charge port 11 includes a plurality of metallized electromagnetic interference (EMI) fingers 16 that protrude into the opening 14 and that are adapted to press against the inductive charging coupler 20. The EMI fingers 16 may be comprised of tinned copper, for example.

The inductive charging coupler 20 is comprised of a plastic coupler housing 22 that has two mating coupler halves 22a, 22b that are configured to provide a handle 23. The inductive charging coupler 20 is comprised of a center magnetic core 24 or "puck" 24, that may be comprised of ferrite, for example. A primary winding 25 is disposed around the center magnetic core 24. A charger cable 26, or other current carrying means 26, is coupled to the primary winding 25 and to an external power source 27 for coupling energy to the charging coupler 20. The charging coupler 20 is designed to be inserted into the opening 14 of the charge port 11 in order to couple current to the battery 15 front the external power source 27.

The mating coupler halves 22a, 22b of the inductive charging coupler 20 enclose the primary winding 25 and the center magnetic core 24, and secures the charger cable 26 in the handle 23. The handle 23 includes a plurality of metallized ribs 28 that engage outer shielding braid 29 of the charger cable 26. A conductive plastic strip 31 is disposed along an exterior portion of the coupler 20 between the handle 23 and the primary winding 25. The conductive plastic strip 31 engages the metallized electromagnetic interference (EMI) fingers 16 when the coupler 20 is inserted into the charge port 11. A strain relief member 32 surrounds the charger cable 26 at a point where it exits the handle 23, and is secured by the two mating coupler halves 22a, 22b.

The coupler housing 22 is made using an insertion molding process. First the conductive plastic strip 31 is molded and then inserted in the mold to make the entire coupler housing 22. The coupler 20 is made in two halves 22a, 22b. The inside walls of the coupler halves 22a, 22b are metalized so the coupler 20 is completely shielded and can be connected internally to the shielded outer shielding braid 29 of the charger cable 26 and to the conductive plastic strip 31. The coupler 20 has the metallized ribs 28 inside of the handle 23 of the coupler housing 22 that make contact with the cable shielding braid 29 after the two coupler halves 22a, 22b are joined together by adhesive or ultrasonic welding methods. The conductive plastic strip 31 of the coupler 20 is then grounded to the outer braided shield 29 of the charger cable 26. When the coupler 20 is inserted into the charge port 11 located in the vehicle, the conductive plastic strip 31 makes contact with the tinned copper EMI fingers 16 in the charge port 11. The fingers 16 attached to a chassis ground of the vehicle 12. The resistance from the housing 13 of the charge port through the braided shield 29 to the off board connection to the power source 27 is typically less than 2 ohms. The conductive plastic strip 31 is capable of greater than 45 dB attenuation up to a 1 gigahertz charging frequency.

Thus there has been described a new and improved inductive charging apparatus employing a conductive plastic EMI ground for vehicle applications, and the like. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An inductive charging apparatus for use in charging a battery of an electric vehicle, said apparatus comprising:

an inductive charging coupler comprising:
   a center magnetic core;
   a primary winding disposed around the center magnetic core;
   a charger cable coupled between the primary winding and an external power source for coupling energy to the charging coupler;
   a plastic coupler housing that has two mating coupler halves that are configured to provide a handle, and wherein the mating coupler halves enclose the primary winding and the center magnetic core, and secures the charger cable in the handle;
   a plurality of metallized ribs disposed in the handle that engage outer shielding braid of the charger cable;
   a conductive plastic strip disposed along an exterior portion of the coupler between the handle and the primary winding;

a charge port disposed in the electric vehicle and coupled to the battery of the electric vehicle, said charge port comprising:
   an opening into which the inductive charging coupler may be inserted;
   a plurality of metallized electromagnetic interference (EMI) fingers protrude into the opening and that press against the conductive plastic strip when the coupler is inserted into the charge port.

2. The inductive charging apparatus of claim 1 wherein the EMI fingers are comprised of tinned copper.

3. The inductive charging apparatus of claim 1 wherein the center magnetic core is comprised of ferrite.

4. The inductive charging apparatus of claim 1 further comprising a strain relief member surrounding the charger cable at a point where it exits the handle, and that is secured by the two mating coupler halves.

* * * * *